(12) United States Patent
Arita et al.

(10) Patent No.: US 6,281,534 B1
(45) Date of Patent: Aug. 28, 2001

(54) LOW IMPRINT FERROELECTRIC MATERIAL FOR LONG RETENTION MEMORY AND METHOD OF MAKING THE SAME

(75) Inventors: Koji Arita, Colorado Springs, CO (US); Shinichiro Hayashi, Takatsuki (JP); Joseph D. Cuchiaro; Carlos A. Paz de Araujo, both of Colorado Springs, CO (US)

(73) Assignees: Symetrix Corporation, Colorado Springs, CO (US); Matsushita Electronics Corporation (JP)

( * ) Notice: Subject to any disclaimer, the term of this patent is extended or adjusted under 35 U.S.C. 154(b) by 0 days.

(21) Appl. No.: 09/170,417

(22) Filed: Oct. 13, 1998

(51) Int. Cl.$^7$ ............................ H01L 29/76; H01L 29/94; H01L 31/062; H01L 31/113; H01L 31/119
(52) U.S. Cl. ............................................. 257/295; 257/43
(58) Field of Search ..................... 257/295, 43; 361/320, 361/321, 322; 349/171; 247/96, 226, 229

(56) References Cited

U.S. PATENT DOCUMENTS

| | | |
|---|---|---|
| 5,434,102 | 7/1995 | Watanabe et al. . |
| 5,519,234 | 5/1996 | Paz de Araujo et al. . |
| 5,784,310 | 7/1998 | Cuchiaro et al. . |
| 5,909,042 * | 6/1999 | Azuma et al. ...................... 257/295 |
| 5,943,111 | 8/1999 | McMillan . |
| 6,072,207 * | 6/2000 | Yoshimori et al. .................. 257/295 |

FOREIGN PATENT DOCUMENTS

WO96/30938   10/1996   (WO) .

* cited by examiner

Primary Examiner—Caridad Everhart
Assistant Examiner—Igwe U. Anya
(74) Attorney, Agent, or Firm—Patton Boggs LLP

(57) ABSTRACT

A liquid precursor for forming a thin film of ferroelectric metal oxide in an integrated circuit contains metal oxides in excess of the stoichiometrically balanced amount. When the precursor comprises strontium, bismuth, tantalum and niobium for forming strontium bismuth tantalum niobate, the precursor contains excess amounts of at least one of tantalum and niobium. Capacitors containing thin films of layered superlattice material made from a precursor containing excess tantalum and niobium show good polarizability and low percentage imprint after $10^{10}$ negative polarization switching pulses at 75° C., and after $10^9$ negative polarization switching pulses at 125° C.

15 Claims, 5 Drawing Sheets

LOW IMPRINT FERROELECTRIC MATERIAL FOR LONG RETENTION MEMORY AND METHOD OF MAKING THE SAME

BACKGROUND OF THE INVENTION

1. Field of the Invention

The present invention pertains to thin film materials for use in integrated circuits and, more particularly, ferroelectric materials for use in integrated memory circuits. More specifically, the thin film ferroelectric materials are layered superlattice materials that exhibit a low degree of imprinting and polarization fatigue after many repetitions of unidirectional voltage pulses.

2. Statement of the Problem

It is well known that thin film ferroelectric materials may be used in a variety of nonvolatile random access memory devices. For example, U.S. Pat. No. 5,600,587 issued to Koike teaches a ferroelectric nonvolatile random access memory using memory cells consisting of a ferroelectric capacitor and a switching transistor. U.S. Pat. No. 5,495,438 issued to Omura teaches a ferroelectric memory that is formed of ferroelectric capacitors connected in parallel.

The capacitors have ferroelectric materials of different coercive field values and, consequently, can use or store multi-value data. U.S. Pat. No. 5,592,409 issued to Nishimura, et al., teaches a nonvolatile memory including a ferroelectric layer that is polarized by the impressed voltage between two gates.

The polarization or memory storage state is read as a high or lovw current flow across the ferroelectric layer, which permits nondestructive readout. U.S. Pat. No. 5,539,279 issued to Takeuchi, et at., teaches a high speed one-transistor-one-capacitor ferroelectric memory that switches between two modes of operation including a dynamic random access memory ("DRAM") mode and a ferroelectric random access memory ("FERAM") mode.

FIG. 1 depicts an ideal polarization hysteresis curve 100 for ferroelectric thin films. Side 102 of curve 100 is produced by measuring the charge on a ferroelectric capacitor while changing the applied field E from a positive value to a negative value. Side 104 of curve 100 is produced by measuring the charge on the ferroelectric capacitor while changing the applied field E from a negative value to a positive value. The points $-E_c$ and $E_c$ are conventionally referred to as the coercive field that is required to bring polarization P to zero, Similarly, the remnant polarization Pr or −Pr is the polarization in the ferroelectric material at a zero field value. The Pr and −Pr values ideally have the same magnitude, the values are most often different in oractice. Thus, polarizastion measured as 2Pr is calculated by adding the absolute values of the actual Pr and −Pr values even though these values may differ in magnitude. The spontaneous polarization values Ps and −Ps are measured by extrapolating a linear distal end of the hysteresis loop, e.g., end 106, to intersect the polarization axis. In an ideal ferroelectric, Ps equals Pr, but these values differ in actual ferroelectrics due to linear dielectric and nonlinear ferroelectric behavior. A large, boxy, substantially rectangular central region 108 shows suitability for use as a memory by its wide separation between curves 102 and 104 with respect to both coercive field and polarization.

Presently available ferroelectric materials depart from the ideal hysteresis shown in FIG. 1. Researchers have investigated materials for use in integrated ferroelectric devices since the 1970's, but these investigations have not yet been commercially successful due to their departures from the ideal hysteresis. For example, U.S. Pat. No. 3,939,292 issued to Rohrer reports early studies of ferroelectric materials for use in ferroelectric memories were performed on Phase III potassium nitrate In practice, potassium nitrate materials have such low polarizabilities and are so badly afflicted by fatigue and imprint that the materials are practically useless in microelectronic memories.

It is difficult to find ferroelectrics that meet certain commercial requirements.

The best materials for integrated ferroelectric devices are switched using a coercive field that can be obtained from conventional integrated circuit operating voltages, i.e., three to five volts. The materials should have a very high polarization, e.g., one exceeding twelve to fifteen $\mu C/cm^2$ determined as 2Pr, to permit the construction of memories having sufficient densities. Polarization fatigue should be very low or nonexistent. Furthermore, the ferroelectric material should not imprint; i.e., the hysteresis curve should not shift to favor a positive or negative coercive field.

FIG. 2 depicts a hysteresis curve 100 next to curve 200. Curve 200 shows the effect of fatigue on curve 100. Fatigue reduces the separation between curves 102 and 104 defining central region 108. Central region 108 progressively becomes smaller and smaller with additional fatigue. This change in separation is due to the creation of point charge defects arising in the ferroelectric material as a consequence of polarization switching and the associated screening effect of the defects on the applied field. Thus, fatigue causes the ferroelectric material to wear out over time due to repeated polarization switching.

U.S. Pat. No. 5,519,234 issued to Araujo, et al., teaches that the fatigue problem of curve 200 is substantially overcome by the use of layered superlattice compounds, such as the "layered perovskite-like" materials described in Smolenskii, et al., "Ferroelectrics and Related Materials," Gordon and Breach (1984). The layered superlattice compounds are capable of providing a thin film ferroelectric material wherein the polarization state may be switched up to at least $10^9$ times with less than thirty percent fatigue This level of fatigue endurance provides a significant advance in the art because it is at least an order of magnitude better than the fatigue endurance of other ferroelectrics, e.g., lead zirconium titanate ("PZT") or lead lanthanum zirconium titanate ("PLZT")

According to Section 15.3 of the Smolenskii book, the layered perovskite-like materials or layered superlattice compounds are of three general types:

(I) compounds having the formula $A_{m-1}S_2M_mO_{3m+3}$, where $A=Bi^{3-}$, $Ba^{2+}$, $Sr^{2+}$, $Ca^{2-}$, $Pb^{2+}$, $K^+$, $Na^+$ and other ions of comparable size; $S=Bi^{3-}$; and $M=Ti^{4+}$, $Nb^{5+}$, $Ta^{5+}$, $Mo_{6+}$, $W^{6+}$, $Fe^{3+}$ and other ions that occupy oxygen octahedra;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$.

Smolenskii pointed out that the perovskite-like layers may have different thicknesses, depending on the value of m, and that the perovskite $AMO_3$ is, in principal, the limiting example of any type of layered perovskite-like structure with m=infinity. Smolenskii also noted that if the layer with minimum thickness (m=1) is denoted by P and the bismuth-oxygen layer is denoted by B, then the type I compounds may be described as . . . $BP_m BP_m$ . . . Further, Smolenskii noted that if m is a fractional number, then the lattice contains perovskite-like layers of various thicknesses, and that all the known type I compounds are ferroelectrics.

According to the invention, the layered superlattice materials may be summarized more generally under the formula:

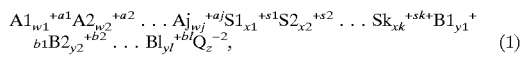 (1)

where A1, A2 . . . Aj represent Asite elements in the perovskite-like structure, which may be elements such as strontium, calcium, barium, bismuth, lead, and others; S1, S2 . . . Sk represent superlattice generator ("S-site") elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the A-sites are occupied by strontium atoms and 25 % of the A-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, as in the present invention, although formula (1) is written in the more general form to include layered superlattice compounds in which the A and B sites and the superlattice generator site can have multiple elements.

The value of z is found from the equation.

$$(a1w1+a2w2 \ldots +ajwj)+(s1 \times 1+s2 \times 2 \ldots +skxk)+(b1y1+b2y2 \ldots +blyl)=2z. \qquad (2)$$

Formula (1) includes all three of the Smolenskii type compounds.

The layered superlattice materials do not include every material that can be fit into the formula (1), but only those which spontaneously form themselves into crystalline structures with distinct alternating layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedra. The term "superlattice generator elements" as applied to S1, S2 . . . Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator; but bismuth, if present in amounts less than a threshold stoichiometric proportion, will spontaneously concentrate as a non-perovskite-like bismuth oxide layer.

Despite the tremendous improvements in low fatigue ferroelectrics attributable to layered superlattice compounds, there remains an imprint problem that is typified by curve 202 of FIG. 2. Curve 202 shows that curve 100 can be imprinted or shifted to the right or lert This imprinting occurs when the ferroelectric material is subjected to repetitive unidirectional voltage pulses. The ferroelectric material retains a residual polarization or bias that shifts sides 102 and 104 in a positive or negative direction with respect to the applied field. Thus, curve 202 has been shifted in a positive direction 204 by repeated negative pulsing of a ferroelectric capacitor. A shift in the opposite direction could also occur due to repetitive pulsing by positive voltage. This type of pulsing represents what happens to the ferroelectric materials as a consequence of repeated unidirectional voltage cycling, such as the sense operations in FERAMs (ferroelectric random access memories). Imprint can be so severe that the ferroelectric material can no longer retain a binary polarization state corresponding to a logical 1 or 0 value.

U.S. Pat. No. 5,592,410 issued to Verhaeghe refers to ferroelectric imprint phenomenon as 'compensation.' The '410 patent teaches that the imprint problem can be reversed by pulsing voltage during the write cycle to return the hysteresis loop towards the unimprinted position of FIG. 100, as compared to curve 202. Thus, the imprint problem is reversed by special write operations in which the pulsed voltage is opposite the switching voltage. Stili, the recommended voltage pulsing does not address the entire problem because the imprint phenomenon is a partially irreversible one. The observed imprinting reflects corresponding changes in microstructure of the ferroelectric crystal, e.g., the creation of point charge defects with associated trapping of polarized crystal domains. These changes in microstructure are not all reversible.

There remains a need for ferroelectric thin film materials that are substantially free of the imprint and polarization-fatigue problems.

3Solution to the Problem

The present invention alleviates the problems that are mentioned in the discussion above by providing a ferroelectric thin film which remains essentially free of imprint when it is used under standard integrated circuit operating conditions, i.e., at voltages ranging from ± three to five volts or less and temperatures ranging from −55° C. to 150° C. The ferroelectric thin film is useful in integrated circuit memories and provides exceptionally high polarization with boxy hysteresis characteristics. Thin film ferroelectric materials according to the invention show percentage imprint values in the range of only about five to ten percent after $10^{10}$ unidirectional voltage pulses at a temperature of 75° C., and $10^9$ pulses at 125° C. Also, their polarizability after voltage cycling remains at a high level, corresponding to greater than 12 $\mu C/cm^2$.

Thus, electronic devices containing thin film ferroelectric materials according to the present invention are essentially imprint-free and fatigue-free, This improvement derives from the use of thin film ferroelectric material comprising layered superlattice materials containing an excess of B-site elements In the example below, the layered superlattice material comprised strontium bismuth tantalum niobate made from precursors containing amounts of tantalum and niobium in excess of the stoichiometric amounts. The balanced stoichiometric formula for strontium bismuth tantalum nlobate is:

$$SrBi_2(Ta_{1-x}Nb_x)_2O_9, \quad (3)$$

wherein $0 \leq x \leq 1$. The "non-stoichiometric" formula for strontium bismuth tantalum niobate can be written as:

$$(SrBi_2(Ta_{1-x}Nb_x)_2O_9)_p(Bi_2O_3)_q(Ta_2O_5)_r(Nb_2O_5)_s(SrO)_t, \quad (4)$$

which can be viewed conceptually as a mixture of bismuth-layered superlattice oxide compound and simple oxides of each element. The experimental results show generally that when the thin film is made from a precursor solution in which $t=0.0 \leq x \leq 1.0 \leq q \leq p$, $0 \leq x \leq 1$, $0 \leq q \leq p$, and the sum of r plus s is greater than zero and less than p, then good polarizability and imprint characteristics are achieved.

Formula (3) corresponds to the general formula (1) wherein the A-site metal is strontium, the S-site metal (i.e., superlaftice generator) is bismuth, the B-site metals are niobium and tantalum, and z=9. Formula (3) corresponds more specifically to the Smolenskii formula of type 1, where the A-site metal is strontium, the S-site metal is bismuth, the M-site metals are niobium and tantalum, and m 2. Formula (4) corresponds to formula (3), except that it provides for additional, nonstoichiometric amounts of A-, S- and B-site elements.

The thin film ferroelectric material of the invention is preferably less than about 6000 Å thick, and is more preferably less than about 4000 Å thick, with the most preferred thickness being about 2000 Å.

Thin films of strontium bismuth tantalum niobate exhibit superior resistance against imprint in the intended environment of use within integrated circuits. For example, preferred devices at 75° C. can withstand $10^{10}$ unidirectional (negative) voltage pulse cycles each having a voltage amplitude of three volts with as little as six percent opposite-state imprint. Similarly, the preferred devices at 125° C. can withstand over $10^9$ unidirectional voltage pulse cycles each having a magnitude ranging from three to five volts with less than five percent imprint.

It is, therefore, an object of the invention to provide a precursor containing metal moieties in effective amounts for forming a ferroelectric layered superlattice compound, whereby the precursor contains a relative amount of at least one B-site element greater than the stoichiometrically balanced amount of the at least one B-site element.

A feature of the invention is that the precursor contains a relative amount of at least one A-site element less than the stoichlometrically balanced amount of the at least one A-site element.

Another object of the invention is to provide a precursor containing metal moieties in amounts corresponding approximately to the stoichiometrically unbalanced formula $A_aS_bB_cO_{[g+(a-1)+(b-2)(1.5)+(c-2)(2.5)]}$, where A represents at least one A-site element, S represents at least one superlattice generator element, B represents at least one B-site element, $a \leq 1$, $b \geq 2$, and $c > 2.4$.

Another object of the invention is to provide a precursor in which the metal moieties are strontium (Sr), bismuth (Bi), tantalum (Ta) and niobium (Nb) present in relative amounts corresponding approximately to the stoichiometrically unbalanced chemical formula $Sr_aBi_b(Ta_cNb_d)O_{[g+(a-1)+(b-2)(1.5)+(c+d-2)(2.5)]}$, where $a \leq 1$, $b \geq 2$, and $(c+d) > 2$. In one preferred embodiment of the invention, a=1, $2.1 \leq b \leq 2.2$, and $(c+d) > 2$, and more preferably $2 < (c+d) \leq 2.4$. This preferred embodiment is particularly effective when $(c+d)$ is approximately 2.3, and proven effective when the ratio c/d is approximately 0.6/0.4.

A further object of the invention is to provide a method for forming a first electrode on a substrate, applying the precursor described above to form a thin film containing the ferroelectric layered superlattice compound, and forming a second electrode on the thin film.

A further object of the invention is to provide a ferroelectric device in an integrated circuit comprising a thin film of layered superlattice material containing a relative amount of at least one B-site element greater than the stoichiometrically balanced amount of the at least one B-site element. In a preferred embodiment of the ferroelectric device of the invention, the layered superlattice material contains a relative amount of at least one A-site element less than the stoichiometrically balanced amount of the at least one A-site element. A feature of the invention is that the thin film contains metal moieties in amounts corresponding approximately to the stoichiometrically unbalanced formula $A_aS_bB_cO_{[g+(a-1)+(b-2)(1.5)+(c-2)(2.5)]}$, where A represents at least one A-site element, S represents at least one superlattice generator element, B represents at least one B-site element, $a \leq 1$, $b \geq 2$, and $c > 2$.

In a preferred embodiment of the ferroelectric device, the thin film contains strontium, bismuth, tantalum and niobium in amounts corresponding approximately to the stoichiometrically unbalanced chemical formula $Sr_aBi_b(Ta_cNb_d)O_{[g+(a-1)+(b-2)(1.5)+(c+d-2)(2.5)]}$, where $a \leq 1$, $b \geq 2$, and $(c+d) > 2$. Preferably, $a \leq 1$, $2.1 \leq b \leq 2.2$, and $(c+d) > 2$, and more preferably, $2 < (c+d) \leq 2.4$. This preferred embodiment is particularly effective when $(c+d)$ is approximately 2.3, and proven effective when the ratio c/d is approximately 0.6/0.4.

Another object of the invention is a ferroelectric device comprising a first electrode, a second electrode, and a thin film of layered superlattice material as described above, whereby the thin film is located substantially between the first and second electrodes.

Other features, objects, and advantages will become apparent to those skilled in the art upon reading the detailed description below in combination with the accompanying drawings.

DETAILED DESCRIPTION OF THE PREFERRED EMBODIMENT

1. Overview

Figure 3:
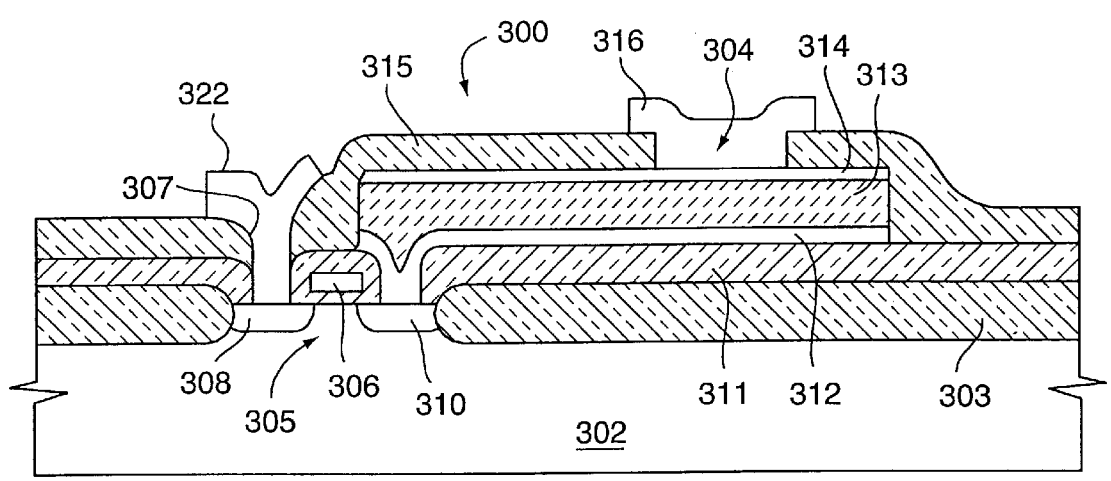
FIG. 3 depicts a layered construction showing how individual memory cells may be implemented in an integrated circuit memory implementing the invention.
Figure 5:
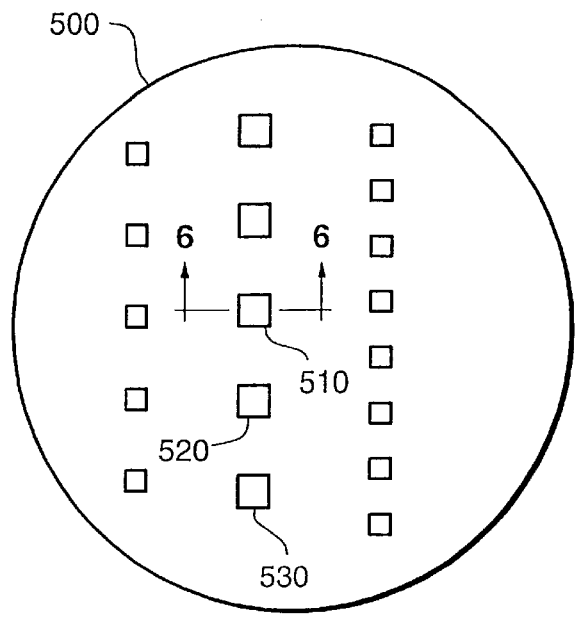
FIG. 5 is a top view of an exemplary wafer on which thin film capacitors fabricated in accordance with the invention are shown greatly enlarged.
Figure 6:
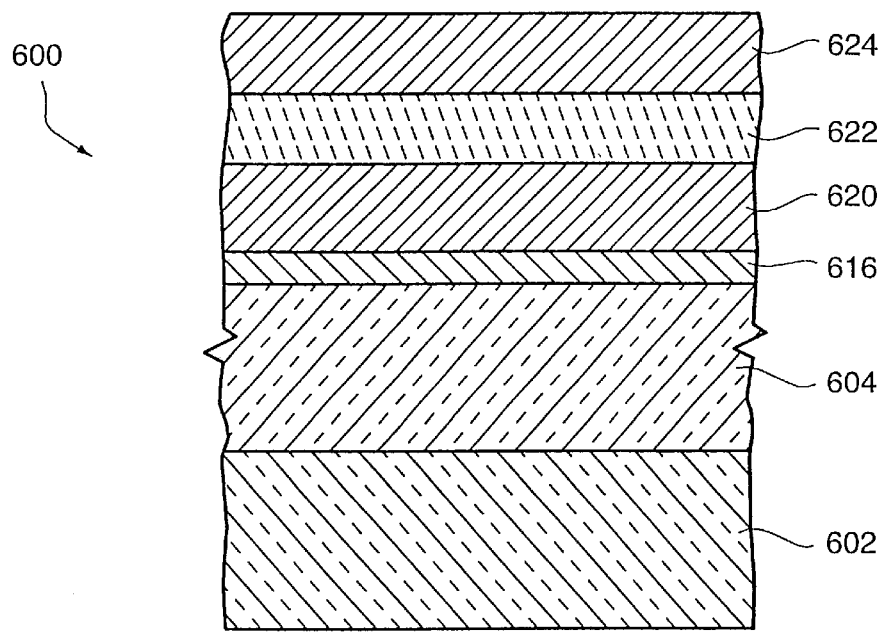
FIG. 6 is a portion of a cross-section of FIG. 5 taken through the lines 6—6, illustrating a thin film capacitor device fabricated in accordance with the invention.

It should be understood that FIGS. 3, 5–6 are not meant to be actual plan or cross-sectional views of any particular portion of an actual integrated circuit device or component. In the actual devices the layers will not be as regular and the thicknesses may have different proportions. The various layers in actual devices often are curved and possess overlapping edges. The figures instead show an idealized representation which is employed to depict more clearly and fully the structure and process of the invention than would otherwise be possible. Also, the figures represent only one of innumerable variations of ferroelectric devices and structures that could be fabricated using the method of the invention.

The general manufacturing steps for fabricating integrated circuits containing MOSFETs and ferroelectric capacitor elements is described in Yoshimori, U.S. Pat. No. 5,561,307, which is hereby incorporated by reference as if completely contained herein. General fabrication methods have been described in other references also Therefore, the elements of the circuit of FIG. 3 will be simply identified here.

In FIG. 3 there is shown a cross-sectional view of an exemplary nonvolatile ferroelectric memory cell that could be fabricated according to the method of the invention. As shown in FIG. 3, memory cell 300 includes a thin film ferroelectric layer 313 of strontium bismuth tantalum niobate having an empirical formula according to Formula (4) above A wafer 302 may be any wafer including ruby, sapphire, quartz, or gallium arsenide, but is most preferably a commercially available silicon wafer having a thick oxide layer 303 for isolation. Wafer 302 is doped to provide source/drain regions 308 and 310. Isolation layer 311 is preferably made of spun-on glass. Bottom electrode 312 is preferably made of sputter-deposited platinum and titanium, but any suitable conductor may be used. The platinum of bottom electrode 312 typically has a thickness in the range of 1500–3500 Å, and preferably about 2000 Å, and a titanium adhesion layertypically has a thickness in the range 200–500 Å. In accordance with the invention, thin-film ferroelectric layer 313 contains layered superlattice material having excess amounts of B-site elements to improve fatigue characteristics. Top electrode 314 typically has a thickness in the range of 1500–3500 Å, and preferably about 2000 Å thick platinum. Interlayer dielectric layer 315, formed using conventional materials and methods, covers top electrode 314 and insulation layer 311. Wiring layers 316 and 322 preferably comprise a conventional metallization stack having an aluminum top layer on at least one underlying adhesion and/or barrier layer, such as the combination Al/TiN/Ti or Al/TiW.

Figure 4:
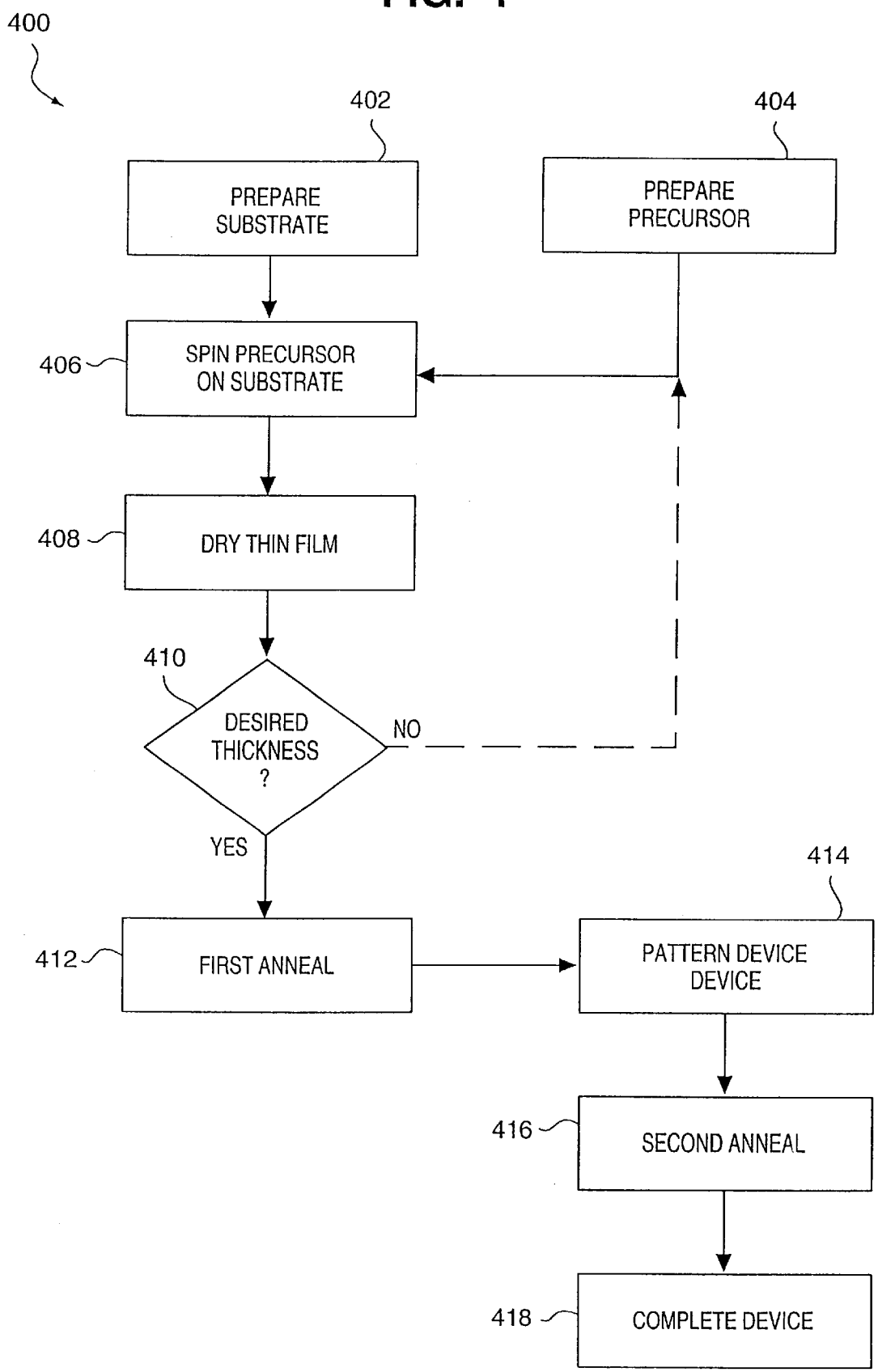
FIG. 4 depicts a schematic process flowsheet for use in making a memory cell corresponding to the layered construction of FIG. 3.

FIG. 4 depicts a schematic process diagram of process 400 for fabricating memory cell 300 of the present invention. In step 402, wafer 302 is made ready by conventional means to receive thin film ferroelectric layer 313. Accordingly, a wafer 302 may be heated in an oxygen diffusion furnace to grow oxide layer 303. A contact hole 307 may be formed through oxide layer 303 by ion etching or other techniques to expose wafer 302, which is then n or p-doped by conventional means to provide source/drain regions 308 and 310. Gate 306 is formed by conventional means. Isolation layer 311 may be deposited as spin-on glass or other conventional materials. Bottom electrode 312 is sputtered into place and annealed by conventional means. Process 400 differs from conventional processes in the formation of thin film ferroelectric layer 313.

Step 404 includes the preparation of a liquid precursor. It is preferred to use a metal alkoxycarboxylate precursor that is prepared according to the reactions;

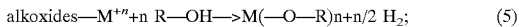

alkoxides—$M^{+n}$+n R—OH—>M(—O—R)n+n/2 $H_2$;     (5)

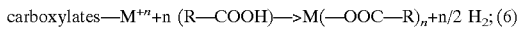

carboxylates—$M^{+n}$+n (R—COOH)—>M(—OOC—R)$_n$+n/2 $H_2$; (6)

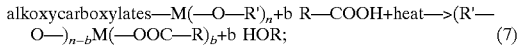

alkoxycarboxylates—M(—O—R')$_n$+b R—COOH+heat—>(R'—O—)$_{n-b}$M(—OOC—R)$_b$+b HOR;     (7)

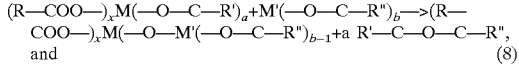

(R—COO—)$_x$M(—O—C—R')$_a$+M'(—O—C—R")$_b$—>(R—COO—)$_x$M(—O—M'(—O—C—R")$_{b-1}$+a R'—C—O—C—R", and     (8)

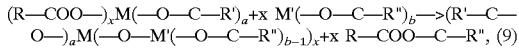

(R—COO—)$_x$M(—O—C—R')$_a$+x M'(—O—C—R")$_b$—>(R'—C—O—)$_a$M(—O—M'(—O—C—R")$_{b-1}$)$_x$+x R—COO—C—R", (9)

where M is a metal cation having a charge of n; b is a number of moles of carboxylic acid ranging from 0 to n; R' is preferably an alkyl group having from four to 15 carbon atoms; R is an alkyl group having from three to nine carbon atoms; R" is an alkyl group preferably having from about zero to 16 carbons: and a, b, and x are integers denoting relative quantities of corresponding substituents that satisfy the respective valence states of M and M'. M and M' are preferably selected from the group consisting of strontium, bismuth, niobium and tantalum. The exemplary discussion of the reaction process given above is generalized and, therefore, nonlimiting. The specific reactions that occur depend on the metals, alcohols, and carboxylic acids used, as well as the amount of heat that is applied.

A reaction mixture including an alcohol, a carboxylic acid, and the metals, is refluxed at a temperature ranging from about 70° C. to 200° C. for one to two days, in order to facilitate the reactions. The reaction mixture is then distilled at a temperature above 100° C. to eliminate water and short chain esters from solution. The alcohol is preferably 2-methoxyethanol or 2-methoxypropanol. The carboxylic acid is preferably 2-ethylhexanoic acid. The reaction is preferably conducted in a xylenes or n-octane solvent. The reaction products are diluted to a molarity that will yield from 0.1 to 0.3 moles of the desired strontium bismuth tantalum niobate material per liter of solution.

The layered superlattice materials that derive from process 400 work best in their intended environment of use if the liquid precursor solutions of step 404 are mixed to include an excess bismuth amount corresponding to subscript q in Formula (4). Materials for thin film ferroelectric layer 313 have been prepared to include excess bismuth amounts of 100 percent and more. Excess bismuth is preferably added in an amount ranging from five percent to ten percent of the stoichiometrically balanced amount of bismuth that is required to satisfy the Smolenskii type I formula which is shown above.

Preparation of precursors of layered superlattice compounds, in general, and particularly of strontium bismuth tantalum niobate precursors, has been described in detail in U.S. Pat. No. 5,434,102, issued Jul. 18, 1995, and U.S. Pat. No. 5,559,260, issued Sep. 24, 1996, which are hereby incorporated by reference as if fully contained herein, as well as in other publications In step 406, the precursor solution from step 404 is applied to the substrate from step 402, which presents the uppermost surface of bottom electrode 312 for receipt of thin film ferroelectric layer 313 Application of the liquid precursor is preferably conducted by dropping one to two ml of the liquid precursor Solution at ambient temperature and pressure onto the uppermost surface of bottom electrode 312 and then spinning wafer 302 at up to about 2000 RPM for about 30 seconds to remove any excess solution and leave a thin-film liquid residue The most preferred spin velocity is 1500 RPM. Alternatively, the liquid precursor may be applied by a misted deposition technique or chemical vapor deposition.

In steps 408 and 410, the precursor is thermally treated to form a solid metal oxide having a mixed layered superlattice structure. This treating step is conducted by drying a liquid precursor film that results from step 406 . In step 408, the precursor is dried on a hot plate in a dry air atmosphere and at a temperature of from about 200° C. to 500° C. for a sufficient time duration to remove substantially all of the organic materials from the liquid thin film and leave a dried metal oxide residue. This period of time is preferably from about one minute to about 30 minutes. A 400° C. drying temperature for a duration of about two to ten minutes in air is most preferred This high temperature drying step is essential in obtaining predictable or repeatable electronic properties in the final crystalline compositions of layered superlattice material to be derived from process 400.

In step 410, if the resultant dried precursor residue from step 408 is not of the desired thickness, then steps 406 and 408 are repeated until the desired thickness is obtained. A thickness of about 1800 Å typically requires two coats of a 0.130M solution under the parameters disclosed herein In step 412, the dried precursor residue is annealed to form the ferroelectric thin film layer 313 of layered superlattice material (see FIG. 3). This annealing step is referred to as the first anneal to distinguish it from a later annealing step. The first anneal is preferably performed in oxygen at a temperature of from 500° C. to 1000° C. for a time from 30 minutes to two hours. Step 412 is more preferably performed at from 750° C. to 850° C. for 80 minutes, with the most preferred anneal temperature being about 800° C. The first anneal of step 412 most preferably occurs in an oxygen atmosphere using an 80 minute push/pull process including five minutes for the "push" into the furnace and five minutes for the "pull" out of the furnace. The indicated anneal times include the time that is used to create thermal ramps into and out of the furnace.

In step 414, the top electrode 314 is deposited by sputtering. The device is then patterned by a conventional photoetching process including the application of a photoresist followed by ion etching, as will be understood by those skilled in the art This patterning preferably occurs before the second annealing step 416 so that the second anneal will serve to remove patterning stresses from memory cell 300 and correct any defects that are created by the patterning procedure.

The second annealing step, 416, is preferably conducted in like manner with the first anneal in step 412, taking care not to vary the annealing temperature by an amount greater than a small temperature range of from about 50° C. to 100° C. with respect to the first (e.g., 800° C.) annealing temperature The time for the second anneal is preferably from about 20 to 90 minutes in duration, and a duration of about 30 minutes is most preferred.

Finally, in step 418, the device is completed and evaluated The completion may entail the deposition of additional layers, ion etching of contact holes, and other conventional procedures, as will be understood by those skilled in the art. Wafer 302 may be sawed into separate units to separate a plurality of integrated circuit devices that have been simultaneously produced thereon FIG. 5 is a top view of an exemplary wafer on which thin film capacitors 510, 520 and 530 fabricated on substrate 500 in accordance with the invention are shown greatly enlarged. FIG. 6 is a portion of a cross-section of FIG. 5 taken through the lines 6–6, illustrating a thin film capacitor device fabricated in accordance with the invention. A silicon dioxide layer 604 is formed on a silicon wafer 602. A titanium adhesion layer 616 is formed on the silicon dioxide layer 604. Then bottom electrode 620 made of platinum is sputter-deposited on adhesion layer 616. Thin film ferroelectric layer 622 comprises layered superlattice material. Top electrode 624 is made of platinum.

The following non-limiting example sets forth preferred materials and methods for practicing the invention hereof.

EXAMPLE 1

Unidirectional Pulse Testing of a Strontium Bismuth Tantalum Niobate Ferroelectric Capacitor at Elevated Temperatures The polarizability and the percentage imprint after unidirectional voltage cycling at elevated temperatures were calculated using PUND-curve measurements.

A plurality of ferroelectric capacitors 600 of the type shown in FIG. 6 were formed on a silicon wafer 602 having a silicon dioxide layer 604, a titanium adhesion layer 616, a Pt bottom electrode 620, and a Pt top electrode 624. Initial precursor solutions respectively comprising strontium 2-ethylhexanoate, bismuth 2-ethylhexanoate, tantalum 2-ethylhexanoate and niobium 2-ethylhexanoate in an octane-based solvent were used to prepare a final precursor solution. The solvent n-octane was the principal solvent used The thin film ferroelectric layer 622 was prepared from the final liquid precursor solution. The final liquid precursor was made by mixing the initial individual metalorganic precursors for each of the metal elements corresponding to the empirical formula:

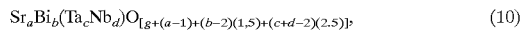

$$Sr_aBi_b(Ta_cNb_d)O_{[g+(a-1)+(b-2)(1.5)+(c+d-2)(2.5)]}, \quad (10)$$

where b=2.18 and a, c and d were varied as indicated in Tables I and II Formula (10) expresses the same molar ratios of elements inherent in Formula (4), but in the more familiar form of Formula (3) The molarity of the final precursor solution was approximately 0.2 moles per liter.

Ferroelectric capacitors containing the layered superlattice compound were formed from the precursor solution in general accordance with the method described in Watanabe, U.S. Pat. No. 5,434,102, which is hereby incorporated by reference as if wholly contained herein.

A series of p-type 100 Si wafers 602 were oxidized to form silicon dioxide layers 604. An adhesion layer 616 consisting substantially of titanium was deposited on the substrate, followed by formation of a platinum bottom electrode 620 having a thickness of 300 nm. Next, the wafers were dehydrated for 30 minutes at 180° C. in low vacuum A first spincoat of 0.2 molar solution of the strontium bismuth tantalum niobate compound was deposited on the bottom electrode 620 at about 2500–2800 rpm for 30 seconds. This was dehydrated for two minutes at 150° C., increasing to 260° C. for four minutes. The first spincoat was "pushed" into a furnace during a period of 22.5 minutes, where it was annealed at 800° C. for 10 minutes with an oxygen flowrate of six liters/minute, and then "pulled" from the furnace for 22.5 minutes. This sequence of the spincoat and anneal steps was repeated for a second spincoat. The sequence was repeated for a third spincoat, except the furnace-anneal step was performed for 60 minutes. These steps formed a thin film ferroelectric layer 622 having a thickness of 230±10 nm, as indicated in Table I. Platinum was sputter-deposited to make top electrode layer 624 with 200 nm thickness The platinum and strontium bismuth tantalum niobate layers were ion-milled to form the capacitors, and then ashing was performed, followed by a second $O_2$ anneal for 30 minutes at 800° C. The capacitors had a surface area of 6940 square microns.

after unidirectional voltage cycling. The PUND measurements show, therefore, the fatigue-effects in the capacitors.

Figure 1:
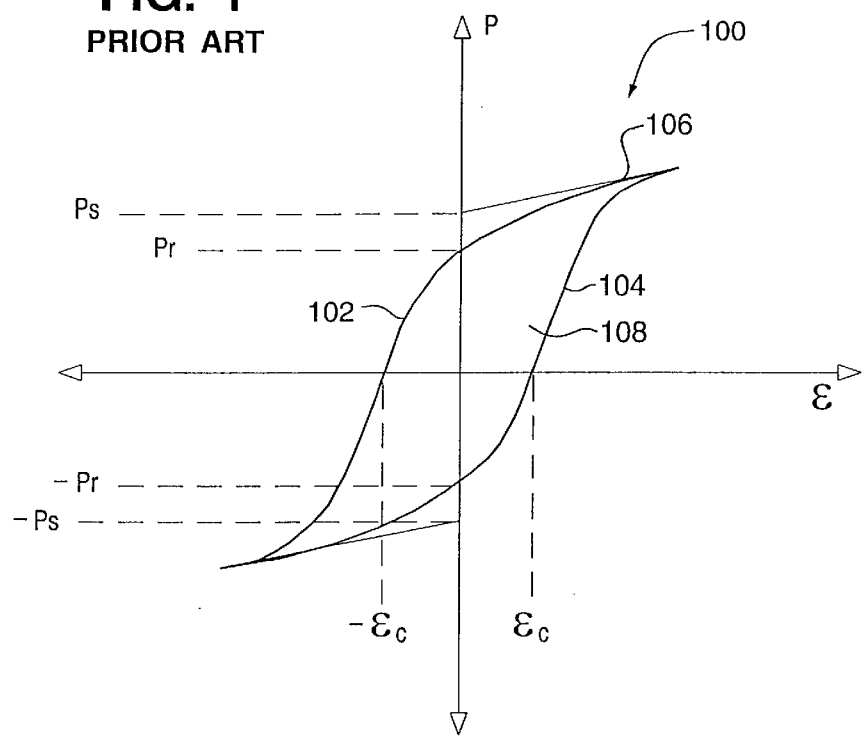
FIG. 1 depicts an idealized conventional ferroelectric polarization hysteresis curve with reference to conventional nomenclature used to describe aspects of the curve.
Figure 2:
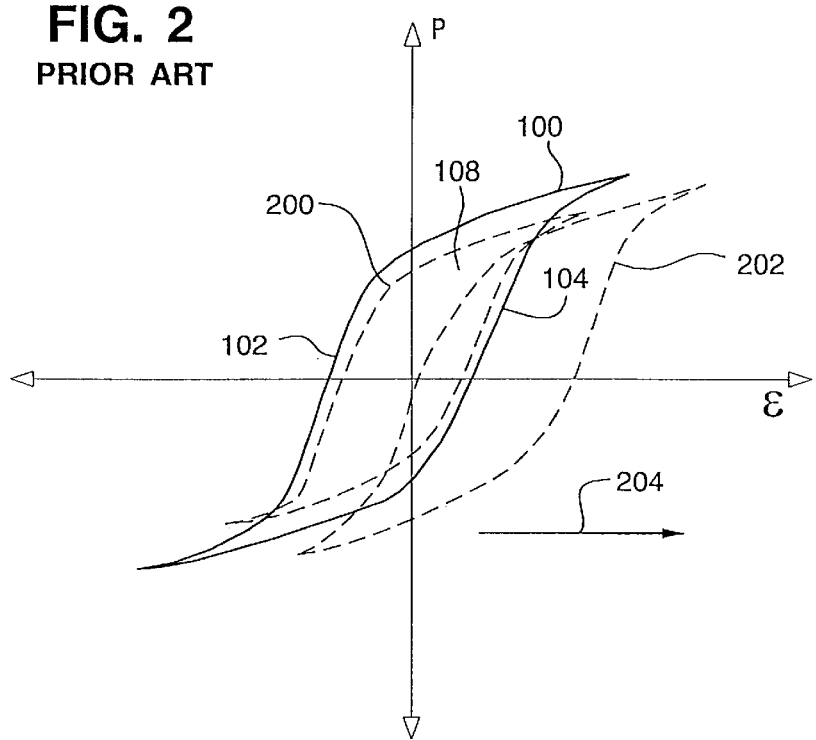
FIG. 2 depicts the idealized FIG. 1 curve adjacent other curves demonstrating polarization fatigue and polarization imprint problems.

A Hewlett Packard 8115A dual channel pulse generator and a Hewlett Packard 54502A digitizing oscilloscope were connected to a $10^{-8}$ Farad load capacitor. Probes were positioned to contact the bottom electrode 620 and the top electrode 624 for conducting PUND switching measurements. PUND switching curves are generally plotted on graphs in terms of charge displacement, $\mu C/cm^2$, versus time in seconds. As shown in the exemplary graph of FIG. 7, PUND curves are generated in a well-known manner by first initializing the sample with two pulses in the negative direction, then measuring the charge across a load capacitor for a series of four voltage pulses that give the measurement its name: a positive (P) pulse, a second positive or up (U) pulse, a negative (N) pulse, and then another negative or down (D) pulse. All pulses have the same absolute amplitude The initial negative pulses make sure the material starts with a negative polarization by switching from a linear dielectric pattern to a nonlinear ferroelectric pattern as domains in the ferroelectric material become oriented to the applied field. The first positive. "Psp" or "P", pulse therefore switches the material to a positive polarization along side 104 of curve 100 (see FIG. 1). Since the sample is already polarized positively with a remnant ferroelectric charge +Pr, the second pulse "Psu" or "U" measures the change from linear dielectric loss between the remnant polarization Pr and the spontaneous polarization Ps in the positive direction. Likewise, the "Psn" or "N" pulse measures the negative switched charge, and the "Psd" or "D" pulse measures the change from linear dielectric loss between the remnant polarization -Pr and the spontaneous polarization -Ps in the negative direction. One effect of imprinting is to impair memory readout by shifting the Psp and Psu curves towards or away from 0 $\mu C/cm^2$. That is, as the effects of residual polarization increase as a result of fatigue from unidirec-

TABLE 1

SUMMARY OF EXPERIMENTAL RESULTS FOR CAPACITORS MADE FROM PRECURSOR WITH EMPIRICAL FORMULA
$Sr_aBi_b(Ta_cNb_d)O_{[9+(a-1)+(b-2)(1.5)+(c+d-2)(2.5)]}$

| | | | | | | | After Cycling Prp + Prd | | |
| | Formula Subscripts b = 2.18 | | | | | Before | Test 1 75° C. | Test 2 125° C. | Film |
| Wafer No. | Sr (a) | Ta (c) | Nb (d) | Ta + Nb (c + d) | Ta/Nb ratio | Cycling 2Pr @ 3V | $10^{10}$ cycles | $10^9$ cycles | Thickness nm |
|---|---|---|---|---|---|---|---|---|---|
| 1 | 1 | 1.2 | 0.8 | 2 | 0.6/0.4 | 5.80 | 4.60 | 3.65 | 225 |
| 2 | 1 | 1.2 | 0.8 | 2 | | 6.23 | 5.03 | 3.51 | 225 |
| 3 | 1 | 1.25 | 0.8 | 2.05 | 0.625/0.4 | 15.54 | 13.55 | 11.37 | 230 |
| 4 | 1 | 1.25 | 0.8 | 2.05 | | 15.14 | 13.35 | 10.73 | 230 |
| 5 | 1 | 1.26 | 0.84 | 2.1 | 0.6/0.4 | 18.18 | 17.28 | 14.66 | 230 |
| 6 | 1 | 1.26 | 0.84 | 2.1 | | 17.12 | 15.73 | 13.31 | 230 |
| 7 | 1 | 1.3 | 0.8 | 2.1 | 0.65/0.4 | 16.92 | 15.48 | 13.29 | 225 |
| 8 | 1 | 1.3 | 0.8 | 2.1 | | 16.94 | 15.77 | 13.45 | 225 |
| 9 | 1 | 1.2 | 0.9 | 2.1 | 0.65/0.45 | 15.27 | 13.55 | 11.77 | 240 |
| 10 | 1 | 1.2 | 0.9 | 2.1 | | 14.79 | 13.79 | 11.07 | 240 |
| 11 | 1 | 1.38 | 0.92 | 2.3 | 0.6/0.4 | 12.50 | 14.20 | 13.35 | 230 |
| 12 | 1 | 1.38 | 0.92 | 2.3 | | 12.19 | 13.88 | 13.01 | 220 |
| 13 | 1.1 | 1.2 | 0.8 | 2 | 0.6/0.4 | 1.68 | — | 0.23 | 225 |
| 14 | 1.1 | 1.2 | 0.8 | 2 | | 1.67 | — | 0.26 | 225 |
| 15 | 1.2 | 1.2 | 0.8 | 2 | 0.6/0.4 | leaky | — | — | 220 |
| 16 | 1.2 | 1.2 | 0.8 | 2 | | leaky | — | — | 220 |

TABLE 2

SUMMARY OF EXPERIMENTAL RESULTS FOR CAPACITORS MADE FROM PRECURSOR WITH EMPIRICAL FORMULA
$Sr_aBi_b(Ta_cNb_d)O_{[9+(a-1)+(b-2)(1.5)+(c+d-2)(2.5)]}$

| | | | | | | Percentage Imprint | |
| Wafer No. | Formula Subscripts b = 2.18 | | | | Polarizability | Test 1 75° C. | Test 2 125° C. |
| | Sr (a) | Ta (c) | Nb (d) | Ta + Nb (c + d) | 2Pr @ 3V ($\mu C/cm^2$) | $10^{10}$ cycles | $10^9$ cycles |
|---|---|---|---|---|---|---|---|
| 1 | 1 | 1.2 | 0.8 | 2 | 5.80 | 58.06 | 65.3 |
| 2 | 1 | 1.2 | 0.8 | 2 | 6.23 | 60.00 | -6.4 |
| 3 | 1 | 1.25 | 0.8 | 2.05 | 15.54 | 26.98 | 28.7 |
| 4 | 1 | 1.25 | 0.8 | 2.05 | 15.14 | 16.67 | 29.1 |
| 5 | 1 | 1.26 | 0.84 | 2.1 | 18.18 | 17.12 | 12.8 |
| 6 | 1 | 1.26 | 0.84 | 2.1 | 17.12 | 12.50 | 14.8 |
| 7 | 1 | 1.3 | 0.8 | 2.1 | 16.92 | 13.79 | 12.8 |
| 8 | 1 | 1.3 | 0.8 | 2.1 | 16.94 | 16.55 | 11.8 |
| 9 | 1 | 1.2 | 0.9 | 2.1 | 15.27 | 20.00 | 6.8 |
| 10 | 1 | 1.2 | 0.9 | 2.1 | 14.79 | 5.88 | 13.5 |
| 11 | 1 | 1.38 | 0.92 | 2.3 | 12.50 | 6.66 | -4.5 |
| 12 | 1 | 1.38 | 0.92 | 2.3 | 12.19 | 5.37 | -2.5 |

Three sets of measurements were performed on each capacitor: conventional hysteresis measurements at room temperature, and two sets of PUND-switching measurements at elevated temperatures The hysteresis measurements were used to calculate initial 2Prvalues. The PUND measurements were used to calculate both polarizability and the opposite-state percentage imprint values in the capacitors tional switching, generally less charge is required to polarize the material in the same direction as switching, and more charge is required to polarize the material in the opposite direction, Another related effect is loss of the ability to store data in more than one state because the ferroelectric material can no longer retain two memory polarization states once the hysteresis curve has shifted in such a way that either Pr or −Pr reaches a value of zero.

For a standard architecture of a memory cell (but not for all architectures), the PUND curves indicate the suitability of the material for a nonvolatile ferroelectric switching memory application, Generally, it is desirable that the "P" and "N" curves are well-separated from the "U" and "D" curves, respectively, which provides a large signal in the standard architecture.

Figure 7:
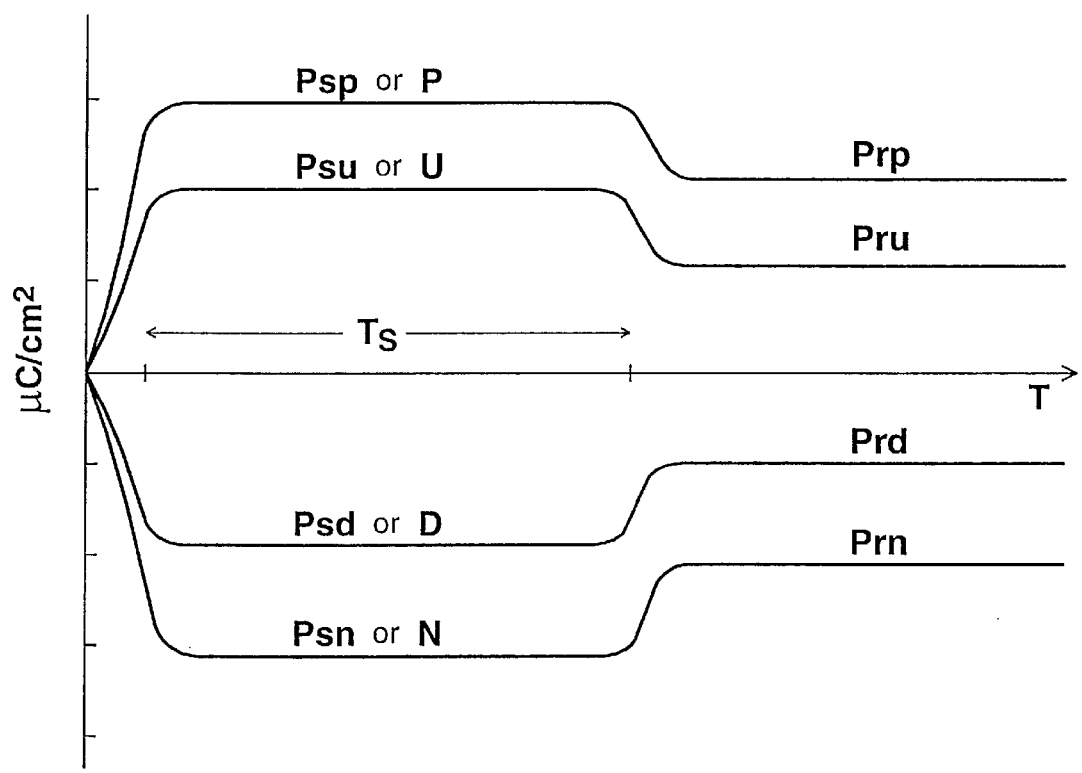
FIG. 7 depicts a schematic representation of a conventional PLUND measurement with reference to standard nomenclature used to describe features of PUND measurements.

Residual polarization values are also illustrated on the curves of FIG. 7 The switching pulse in FIG. 7 is applied during the switching time, $T_s$, commonly named the "pulse width." When the switching pulse voltage is removed, losses due to linear dielectric behavior cause the polarization charge in the ferroelectric material quickly to "relax" to residual values represented on the respective PUND-curves by Prp, Pru, Prn and Prd.

Two sets of PUND measurements were conducted to calculate polarization fatigue and percentage imprint resulting from unidirectional voltage cycling. In Test 1, initial PUND-measurements were made using a switching pulse amplitude of 2.7 volts with a rise time of 30 nanoseconds, a fall time of 30 nanoseconds, and a pulse width of one microsecond, with a pulse delay of 75 nanoseconds between pulses. Following the initial "before" PUND-curve measurements, the PUND measurement apparatus was used to deliver 1010 negative square-wave voltage imprint cycles to the ferroelectric capacitors 600. These pulses each had an imprint amplitude of six volts, and were delivered at one MHz frequency at a temperature of 75° C. The wait time was one second. Then, the "after" PUND-curve measurements were conducted as described above. The measurements were made in a test lab at ambient atmospheric pressure in Colorado Springs, Colo. In Test 2, the capacitors were subjected to $10^9$ negative-polarity imprint cycles at a temperature of 125° C., where the imprint amplitude was three volts and the imprintfrequency was one MHz. The PUND-curve measurements were conducted as in Test 1, except the pulse amplitude was three volts.

The polarizability remaining in each sample capacitor after fatigue-cycling was calculated by adding the absolute values of Prp and Prd from the PUND-curve data, as follows:

$$\text{Polarizability} = \text{Prp} + [\text{Prd}] \quad (11)$$

The value (Prp+[Prd]) corresponds theoretically to the value 2Prfrom an hysteresis curve. Table 1 contains the values of 2Pr from the initial, pre-cycling hysteresis measurements at room temperature and the polarizability-values calculated from PUND-curve data using formula (11). Comparison of the initial hysteresis-curve values shows generally that when the subscript for bismuth equals 2.18, the value of 2Pr improves significantly if the precursor contains relative amounts of the B-site elements, tantalum and niobium, in excess of the stoichiometrically balanced amount. For example, in wafers 1 and 2, the subscript value, (c+d), of the B-site elements was two, that is, the stoichiometrically balanced value, and the 2Pr value was only about six $\mu C/cm2$. Yet, when the amount of B-site elements in the precursor solution was increased to correspond to subscript values, (c+d), of 2.05 to 2.3, the 2Pr values increased to between 12 and 18 $\mu C/cm^2$. Comparison of the 2Pr-values with the after-cycling polarizability values shows that polarization fatigue in the capacitors of wafers 3–10 results in a decrease of five to 15 percent in polarizability after $10^{10}$ cycles at 75° C., and a decrease of 15 to 30 percent after $10^9$ cycles at 125° C. Noteworthy is that the calculated polarizability in the capacitors of wafers 11 and 12 actually increased as a result of the unidirectional voltage cycling. This phenomenon is referred to as the "wake-up" effect of voltage cycling. In contrast, when the ferroelectric material was made from a precursor containing excess strontium, an A-site element, as in wafers 13–16, the capacitors possessed insufficient polarizability.

The percentage imprint resulting from fatigue in each capacitor was calculated by using the PUND-cunre values in the following formula.

$$\% \text{Imprint} = [1-(P_{sn}-P_{su})_{after\ cycling}/(P_{sn}-P_{su})_{before\ ccycling}] \times 100 \quad (12)$$

Low percentage imprintvalues aredesired. Percentage imprint generally increases with number of voltage switching cycles and with higher temperature.

Table II contains values of percentage imprint for the experimental capacitors as calculated using formula (12). Comparison of the values shows generally that the value of percentage imprint improves if the precursor contains relative amounts of bismuth and the B-site elements, tantalum and niobium, in excess of the stoichiornetrically balanced amount. The value of percentage imprint in the wafers 11 and 12 was only about six percent in Test 1, and about (−)4 percent in Test 2. Comparison of the values in Tables I and II shows that both low percentage imprint and good polarizability were obtained in wafers 11 and 12 Thus, an amount of B-site element corresponding to subscript value, (c+d), of 2.3, which was the maximum relative amount tested, resulted in the best overall fatigue behavior in both Test 1 and Test 2.

The ratio of tantalum to niobium in the precursor was approximately 0.6/0.4 in all of the samples tested. It is believed that the desirable effects of adding excess B-site elements to the precursor are achieved also when the Ta/Nb ratio is different from 0.6/0.4. It is a feature of the invention, therefore, that good fatigue characteristics are achieved in ferroelectric elements of integrated circuits when the overall amount of B-site elements in the precursor is in excess of the stoichiometrically balanced amount, regardless of the identity of the B-site elements. In other words, the beneficial effects of excess B-site elements are achieved whether the B-site metal is tantalum, niobium, another metal, or a combination of two or more B-site metals. Another view of the invention is that the precursor used to make the ferroelectric material contains an amount of A-site element that is less than the stoichiometrically balanced amount. Thus, referring to the example, the precursor can be viewed as strontium-poor rather than Ta/Nb-rich.

There has been described a method and structure for fabricating ferroelectric integrated circuits that provide ferroelectric devices with good electrical properties even after large numbers of polarization switching cycles at elevated temperatures. It should be understood thatthe particularembodiments shown in the drawings and described within this specification are for purposes of example and should not be construed to limit the invention which will be described in the claims below. For example, the invention contemplates that the layers 313, 622 in FIGS. 3 and 6 may be made of any layered superlattice material included in Smolenskii's general class (A), and furthermore, may be made of any layered superlattice compound represented by general formula (1).

The invention, therefore, is not limited to only strontium bismuth tantalum niobate. Rather, the invention encompasses any layered superlattice compound made from precursors containing a stoichiometrically excess amount of B-site metal or metals for the purpose of improving fatigue behavior Thus, the invention comprises those layered superlattice compounds which can be represented by the following stoichiometrically unbalanced chemical formula:

$$A_aS_bB_cO_{[g+(a-1)+(b-2)(1.5)+(c-2)(2.5)]}, \quad (13)$$

where A represents at least one A-site element, S represents at least one superlattice generator element, B represents at leastone B-site element, $a \leq 1$, $b \geq 2$, and $c>2$.

Further, it is evident that those skilled in the art may now make numerous uses and modifications of the specific embodiments described, without departing from the inventive concepts. For example, now that a method and structure to provide fatigue-resistant layered superlattice material in an integrated circuit has been identified as an important part of the process for fabricating ferroelectric memory devices, this method can be combined with other processes to provide variations on the method described. It is also evident that the steps recited may in some instances be performed in a different order: or equivalent structures and process may be substituted for the various structures and processes described. Consequently, the invention is to be construed as embracing each and every novel feature and novel combination of features present in and/or possessed by the fabrication processes, electronic devices, and electronic device manufacturing methods described.

What is claimed is:

1. A ferroelectric device in an integrated circuit comprising:
   a thin film of layered superlattice material containing a relative amount of at least one B-site element greater than the stoichiometrically balanced amount of said at least one B-site element, and a relative amount of at least one A-site element less than the stoichiometrically balanced amount of said at least one A-site element.

2. A ferroelectric device as in claim 1 wherein said thin film contains metal moieties in amounts corresponding approximately to the stoichiometrically unbalanced formula $A_aS_bB_cO_{[9+(a-1)+(b-2)(1.5)+(c-2)(2.5)]}$, where A represents at least one A-site element, S represents at least one superlattice generator element, B represents at least one B-site element, $a \leq 1$, $b \geq 2$, and $c>2$.

3. A ferroelectric device as in claim 2 wherein said thin film contains strontium (Sr), bismuth (Bi), tantalum (Ta) and niobium (Nb) in amounts corresponding approximately to the stoichiometrically unbalanced chemical formula $Sr_aBi_b(Ta_cNb_d)O_{[9+(a-1)+(b-2)(1.5)+(c+d-2)(2.5)]}$, where $a \leq 1$, $b \geq 2$, and $(c+d)>2$.

4. A ferroelectric device as in claim 3 where $a=1$, $2.1 \leq b \leq 2.2$, and $(c+d)>2$.

5. A ferroelectric device as in claim 4 where $2<(c+d) \leq 2.4$.

6. A ferroelectric device as in claim 5 where the ratio $c/d$ is approximately 0.6/0.4.

7. A ferroelectric device as in claim 4 where $(c+d)$ is approximately 2.3.

8. A ferroelectric device as in claim 7 further comprising:
   a first electrode; and
   a second electrode, wherein said thin film is located substantially between said first and second electrodes.

9. A liquid precursor comprising metal moieties in effective amounts for spontaneously forming a ferroelectric layered superlattice material upon drying and heating of said precursor, said precursor containing a relative amount of at least one B-site element greater than the stoichiometrically balanced amount of said at least one B-site element, and a relative amount of at least one A-site element less than the stoichiometrically balanced amount of said at least one A-site element.

10. A precursor as in claim 9 wherein said precursor contains metal moieties in amounts corresponding approximately to the stoichiometrically unbalanced formula $A_aS_bB_cO_{[9+(a-1)+(b-2)(1.5)+(c-2)(2.5)]}$, where A represents at least one A-site element, S represents at least one superlattice generator element, B represents at least one B-site element, $a \leq 1$, $b \geq 2$, and $c>2$.

11. A precursor as in claim 9 wherein said metal moieties are strontium (Sr), bismuth (Bi), tantalum (Ta) and niobium (Nb) present in relative amounts corresponding approximately to the stoichiometrically unbalanced chemical formula $Sr_aBi_b(Ta_cNb_d)O_{[9+(a-1)+(b-2)(1.5)+(c+d-2)(2.5)]}$, where $a \leq 1$, $b \geq 2$, and $(c+d)>2$.

12. A precursor as in claim 11 wherein $a=1$, $2.1 \leq b \leq 2.2$, and $(c+d)>2$.

13. A precursor as in claim 12 where $2<(c+d) \geq 2.4$.

14. A precursor as in claim 13 wherein the ratio $c/d$ is approximately 0.6/0.4.

15. A precursor as in claim 12 where $(c+d)$ is approximately 2.3.

* * * * *